United States Patent

Gray

[15] 3,639,123

[45] Feb. 1, 1972

[54] DOUBLE-TRANSFER PROCESS FOR PHOTOHARDENABLE IMAGES

[72] Inventor: Russell Houston Gray, Rumson, N.J.

[73] Assignee: E. I. du Pont de Nemours and Company, Wilmington, Del.

[22] Filed: Oct. 13, 1969

[21] Appl. No.: 865,948

[52] U.S. Cl. .................................. 96/28, 96/35.1, 156/234, 156/235, 156/249, 156/344

[51] Int. Cl. .................................. G03c 11/12

[58] Field of Search .................................. 96/28, 35.1, 48, 115 P; 156/230, 234, 235, 249, 344; 161/146, 145, 38–40

[56] References Cited

UNITED STATES PATENTS

| | | | |
|---|---|---|---|
| 3,060,023 | 10/1962 | Burg et al. | 96/115 |
| 3,060,026 | 10/1962 | Heiart | 96/115 |
| 3,261,686 | 7/1966 | Celeste et al. | 96/115 |
| 3,380,831 | 4/1968 | Cohen et al | 96/115 |
| 3,418,295 | 12/1968 | Schoenthaler | 117/127 |
| 3,448,089 | 6/1969 | Celeste | 260/78.5 |

*Primary Examiner*—John T. Goolkasian
*Assistant Examiner*—D. J. Fritsch
*Attorney*—Lynn Barratt Morris

[57] ABSTRACT

An image-forming process comprises, in order, (1) imagewise exposing a photohardenable layer to actinic radiation to harden the layer throughout the exposed areas while leaving the underexposed areas unhardened, (2) transferring the underexposed material at a temperature between the softening point of the exposed and underexposed areas to a receptor surface, and (3) heating the exposed areas to a temperature above their softening point and transferring said areas to a second receptor surface. The invention provides both positive- and negative-working processes.

9 Claims, No Drawings

DOUBLE-TRANSFER PROCESS FOR PHOTOHARDENABLE IMAGES

CROSS-REFERENCES TO RELATED APPLICATIONS

The photopolymerizable film element of the invention is disclosed in applications to Celeste and Chu, Ser. No. 684,945, filed Nov. 22, 1965, and to Chu and Cohen, Ser. No. 705,323, filed Feb. 14, 1968, abandoned, but first refiled as continuation-in-part application Ser. No. 775,123, Nov. 12, 1968, and entitled IMAGE REPRODUCTION PRODUCT WITH INTEGRAL PIGMENTED LAYER, and Ser. No. 701,487, filed Jan. 29, 1968. Thermal transfer is claimed in applications Ser. Nos. 684,945, and 705,323.

BACKGROUND OF THE INVENTION

This invention relates to image reproduction systems employing photohardenable material. More particularly it relates to such systems where readout is effected by coloring matter which adheres to the imaging layer.

Photopolymerizable systems that make use of thermal transfer to yield photographic images are well known in the art. Assignee's patent to M. Burg and A. B. Cohen, U.S. Pat. No. 3,060,033 and assignee's applications of V. F. H. Chu and A. B. Cohen, U.S. Pat. application Ser. No. 705,323, filed Feb. 14, 1968, now abandoned, and U.S. Pat. application Ser. No. 796,890, filed Feb. 5, 1969, disclose positive-working imaging systems which use photohardenable material for image readout.

The prior art processes for producing a photohardenable image reproduction element involve application of colorant to the imagewise exposed photopolymerizable layer for readout. This is followed by thermal transfer of the underexposed, toned areas. Since the colorant must adhere to the underexposed areas only, nonstaining colorants are the only ones suitable for practicing the prior art methods. This limits the prior art methods in the number of colorants which may be used for image readout. Since the present invention involves image readout of both exposed and underexposed areas, high-stain colorants can be used and in fact, are preferred.

Unlike the prior art methods which afford only a positive-working system, the present invention gives both a positive and a negative system. Also, dot sharpening, which is inherent in most of the prior art positive-working systems of photopolymerizable images, is reduced considerably in the present invention, which affords negative images.

SUMMARY OF THE INVENTION

It is an object of this invention to provide a photohardenable image reproduction process. It is a further object to provide such a process which gives both a positive- and a negative-working system. Said process should also be simple, economical and produce images of high quality.

These and other objects are achieved by an image-forming process comprising (1) imagewise exposing a photohardenable layer to actinic radiation to harden the layer throughout the exposed areas while leaving the underexposed areas unhardened, (2) transferring the underexposed material at a temperature between the softening point of the exposed and underexposed areas to a receptor surface, and (3) transferring the exposed areas to a second receptor surface at a temperature above the softening point of the exposed material.

The present invention gives both a positive- and a negative-working system, unlike other photopolymer imaging systems employing thermal transfer which result in only a positive system. A further advantage of this process is that it can use a wide range of toners for image readout, since stain is no longer a problem. Utilization of inexpensive toners also makes the process more economical than prior art methods. Furthermore, dot sharpening is less likely to occur using the techniques of this invention.

DESCRIPTION OF PREFERRED EMBODIMENT

In practicing a preferred embodiment of this invention, a film element comprising a photopolymerizable layer on a base support is exposed to actinic radiation which raises the melting point of the exposed area. A high-stain pigment, that is, one that colors both the exposed and underexposed areas, is then applied to the photopolymerizable layer. The underexposed areas are then transferred to a suitable receptor by contacting the film element and receptor and heating the photopolymerizable layer to a temperature intermediate between the softening point of the exposed and underexposed areas. The exposed areas remaining on the support are then transferred to a second receptor by bringing the support and receptor into intimate contact and applying heat sufficient to raise the temperature of the exposed area above the melting point, this second transfer usually occurring at least 10°–20° C. above the first transfer. The first transfer, that of the underexposed areas, gives a positive image, while the second transfer gives a negative image.

The film element may be modified to include an integral, positive image receptor sheet laminated to the photopolymerizable layer. In which case the initial transfer is directly onto the delaminated sheet. The film element, comprising a support, a photopolymerizable layer and a laminated receptor sheet, is exposed to actinic radiation and delaminated of its cover sheet at a temperature above the softening point of the underexposed areas of the photopolymerizable layer. This affords a positive image on the delaminated cover sheet. Raising the temperature of the exposed area of the photopolymerizable layer above the softening point allows transfer of the exposed areas to a suitable receptor, affording a negative image.

Transfer temperatures must be such as to set up the following force relationships during transfer:

I.—TRANSFER OF UNDEREXPOSED AREAS

| | | | | |
|---|---|---|---|---|
| Adhesion (underexposed photopolymerizable material to receptor I) | > | Cohesion (underexposed photopolymerizable material) | < | Adhesion. (underexposed photopolymerizable material to base) |
| Adhesion (exposed photopolymer to receptor I) | < | Cohesion (exposed photopolymer) | and | Adhesion. (exposed photopolymer to base) |

II.—TRANSFER OF EXPOSED AREAS

| | | | | |
|---|---|---|---|---|
| Adhesion (exposed photopolymer to receptor II) | > | Cohesion (exposed photopolymer) | < | Adhesion. (exposed photopolymer to base) |

The terms "photopolymerizable" and "photohardenable" as used herein refer to systems in which the molecular weight of at least one component of the photosensitive layer is increased by exposure to actinic radiation sufficient to result in a change in the rheological and thermal behavior of the exposed areas.

Among suitable photopolymerizable or photohardenable systems are: (1) those in which a photopolymerizable monomer is present alone or in combination with a compatible binder, or (2) those in which a photopolymerizable monomer is present alone or in combination with a compatible binder, or (2) those in which the photopolymerizable group is attached to a polymer backbone which becomes activated on exposure to radiation and may then cross-link by reacting with a similar group or other reactive sites on adjacent polymer chains. In the second group of suitable photopolymerizable systems, where the monomer or pendant photopolymerizable group is capable of addition polymerization, e.g., a vinyl monomer, the photopolymerized chain length may involve addition of many similar units initiated by a single photochemical act. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a cross-linked network can be produced.

The term "underexposed" as used herein is intended to cover the image areas of the photopolymerizable layers which are completely unexposed or those exposed only to the extent that there is polymerizable compound still present in sufficient quantity that the molecular weight remains substantially lower than that of the complementary exposed image areas.

If either a simple monomer or monomer-polymer binder is being used, the element should contain a free radical generating addition polymerization initiator in the photopolymerizable layer. In addition, particularly when a photocross-linkable polymer or dimer system is used, the layer may also contain a plasticizing agent.

Suitable free radical initiated chain propagating addition polymerizable ethylenically unsaturated compounds for use in the simple monomer or monomer-polymer binder photopolymerizable layers are described in Burg et al. U.S. Pat. No. 3,060,023, Celeste et al. U.S. Pat. No. 3,261,686; and in assignee's Cohen and Schoenthaler, U.S. Pat. No. 3,380,831, Apr. 30, 1968. Polymers for use in the monomer-polymer binder system and preferred free radical generating addition polymerization initiators are described in U.S. Pat. No. 3,060,023.

Photodimerizable materials useful in the invention are cinnamic acid esters of high molecular weight polyols, polymers having chalcone and benzophenone type groups, and others disclosed in chapter 4 of "Light-Sensitive Systems" by Jaromir Kosar published by John Wiley and Sons, Inc., New York, 1965. Photopolymerizable materials capable of photocross-linking with more than one adjacent polymeric chain to form a network are described in U.S. Pat. Nos. to Schoenthaler No. 3,418,295, Dec. 24, 1968, and Celeste No. 3,448,089, June 3, 1969.

Preferred free radical generating addition polymerization initiators, activatable by actinic light, e.g., ultraviolet and visible light, are listed in U.S. Pat. No. 3,060,023 and the other patents referred to above.

Where the polymer is a hard, high-melting compound a plasticizer is usually used to lower the glass transition temperature and facilitate selective stripping. The plasticizer may be a monomer itself, e.g., a diacrylate ester, or any of the common plasticizers which are compatible with the polymeric binder. Among the common plasticizers are phthalate, polyethylene glycol, and phosphate esters.

Preferred receptors are those to which the heated polymer coating adheres strongly. Such receptors include paper, film, metal, ceramic, and glass.

Colorants which may be used to tone the photopolymerizable layer after exposure should (1) exhibit high stain, i.e., color both the exposed and underexposed areas, (2) have adequate density and color quality, (3) be easy to apply, and (4) be compatible with the photohardenable matrix.

Alternatively, colorant may be incorporated into the photopolymerizable composition prior to coating. Such colorants are disclosed in U.S. Pat. No. 3,060,026.

Additionally, other materials besides colorants can be applied to or incorporated into the photopolymerizable layers, i.e., magnetic materials, e.g., magnetic iron and chromium oxides, electrical or heat conducting materials, hydrophilic or hydrophobic materials.

The exposure of the photopolymerizable element may be through line or halftone negative or positive transparencies. Since most of the photohardenable materials preferred in this invention generally exhibit their maximum sensitivity in the near ultraviolet region, the light source should furnish an effective amount of this radiation. Such sources include carbon arcs, mercury vapor arcs, certain fluorescent lamps, argon glow lamps, electronic flash units and, photographic floodlamps. Other light sources are satisfactory when material sensitive to visible light is used.

The invention will be further illustrated by, but is not intended to be limited by the following detailed examples of various embodiments.

EXAMPLE I

The following solution was prepared:

| | |
|---|---|
| Trichloroethylene | 1732 g. |
| Methyl methacrylate polymer (density = 1.13 g./cc.) | 158 g. |
| 2-Ethylanthraquinone | 5.3 g. |
| 2,2-Dihydroxy-4-methoxybenzophenone | 4.4 g. |
| Polyoxyethylated trimethylolpropane triacrylate (avg. mol. wt. = 1,000 | 175 g. |
| Polyoxyethylene lauryl ether | 26.3 g. |

After stirring for 15 min. at room temperature, the solution was coated onto 0.001-inch thick film of biaxially oriented and heat set polyethylene terephthalate at a coating speed of 10.5 ft./min.

The coating was dried at 65° C. and laminated with a 0.004-inch sheet of resin coated (F. Alles, U.S. Pat. No. 2,779,684, example IV) polyethylene terephthalate.

The photopolymerizable layer was exposed for 7.5 sec. through a positive transparency using a nuArc "Flip Top" Plate Maker, Model FT26L xenon arc light source.

The 0.001-inch sheet of polyethylene terephthalate was removed from the photopolymerizable layer and the coating was dusted with a toner consisting of 50 percent phthalocyanine blue and 50 percent cellulose acetate. The toner adhered to both the exposed and underexposed areas of the film element.

The underexposed areas of the photopolymerizable layer were then transferred to a sheet of "Kromekote" cast coated one side cover paper, manufactured by the Champion Paper and Fiber Company, by laminating the film element to the paper on a fixed-bed transfer machine (as described in assignee's Chu et al. application Ser. No. 700,117, filed Jan. 24, 1968) at 116° C. This afforded a positive-working system.

A negative-working system was then prepared by laminating the film element, consisting of exposed and toned photopolymer on a polyethylene terephthalate base, to a second sheet of Kromekote paper on the fixed-bed transfer machine at 150° C. The photopolymer transferred to the paper receptor when the receptor was stripped from the film base to give a high-quality negative image.

EXAMPLE II

| | | |
|---|---|---|
| Trichloroethylene | | 1,333 g. |
| Methyl methacrylate polymer g. (density = 1.13 g./cc.) | | 225 g. |
| 2-Ethylanthraquinone | | 7.5 g. |
| 2,2-Dihydroxy-4-methoxybenzophenone | | 6.3 g. |
| Polyoxyethylated trimethylolpropane triacrylate (avg. mol. wt. = 1,000) | | 250 g. |
| Polyoxyethylene lauryl ether | | 38 g. |
| Trichloroethylene | to | 3,000 g. |

The above solution was stirred for 15 min. at room temperature and coated onto 0.001-inch thick polyethylene terephthalate at a coating speed of 12 ft./min.

After drying at 65° C., the coating was laminated with 0.004-inch thick, resin-coated polyethylene terephthalate of the type used in example I.

The photopolymerizable layer was exposed for 7.5 sec. through a positive transparency, using the light source of example I; and, after removal of the 0.001-inch sheet of polyethylene terephthalate, the coating was dusted with a toner consisting of 50 percent phthalocyanine green (C.I. Pigment Green 7) and 50 percent cellulose acetate. The toner stained both exposed and underexposed areas of the photopolymerizable layer.

Transferring the underexposed areas of the film element to a sheet of Kromekote paper by lamination on a fixed-bed transfer machine at 80° C. gave a positive image.

The exposed areas remaining on the polyethylene terephthalate base were then transferred to a sheet of aluminum by laminating the aluminum receptor to the photopolymer at 150° C. and then stripping off the receptor. This afforded a negative-working system.

EXAMPLE III

The following solution was prepared:

| | |
|---|---|
| Trichloroethylene | 400 g. |
| Methyl methacrylate polymer (density = 1.13 g./cc.) | 100 g. |
| Trimethylolpropane trimethacrylate | 130 g. |
| 2-Pyrrolidinone | 25 g. |
| 2-o-chlorophenyl-4,5-bis-(m-methoxyphenyl)imidazolyl dimer | 4 g. |
| 2-Mercaptobenzothiazole | 0.4 g. |
| Optical brightener (a reaction product of cyanuric chloride with (a) 7 amino-3-phenyl coumarin and (b) diethylamine in which one chlorine of the cyanuric chloride is reacted with (a), one chlorine with (b), and one chlorine is unreacted) | 0.5 g. |
| Trichloroethylene | to 1,000 g. |

After stirring for 15 min. at room temperature, the solution was coated on a 0.004-inch thick, resin-coated (F. P. Alles, U.S. Pat. No. 2,779,684, example IV), polyethylene terephthalate base support.

The coating was dried at 55° C., and a 0.001-inch cover sheet of polyethylene terephthalate was laminated onto the coating at 50° C.

The photopolymerizable layer was exposed for 6 sec. through a high-contrast positive transparency using the light source of example I. The polyethylene terephthalate cover sheet was removed at room temperature, and Monastral Blue Toner (C.I. Pigment Blue 15) was applied to the photopolymer surface. The pigment adhered to both exposed and underexposed areas.

Lamination of the film element to a sheet of Kromekote paper at 80° C. on a fixed-bed transfer machine resulted in the transfer of the underexposed areas of the photopolymerizable layer to the paper receptor.

The exposed areas remaining on the polyethylene terephthalate base were then transferred to another sheet of Kromekote paper at 180° C.

Both the positive and negative images were then postexposed for 5 minutes using an ultraviolet light source.

EXAMPLE IV

The following solution was prepared:

| | |
|---|---|
| Trichloroethylene | 1,052 g. |
| Methyl methacrylate polymer | 144 g. |
| Polyoxyethylated trimethylolpropane triacrylate | 47 g. |
| Polyoxyethylene lauryl ether | 7.5 g. |
| Phenanthrenequinone | 0.7 g. |

The solution was stirred for one-half hour, and was then coated on a sheet of 0.004-inch thick polyethylene terephthalate.

The coating was allowed to dry. A cover sheet of 0.001-inch thick polyethylene terephthalate coated with a thin vinylidene chloride copolymer sublayer (described in example IV of Alles, U.S. Pat. No. 2,779,684) was then laminated to the clear photopolymerizable layer.

The element was exposed through a positive transparency for 30 seconds using the light source of example I.

Stripping the cover sheet from the photosensitive layer resulted in a positive image on the polyethylene terephthalate support. The exposed areas remained on the cover sheet giving a negative image.

Molybdate Orange Toner (C.I. Pigment Red 104) was applied to the cover sheet and support, coloring both exposed and underexposed areas of the photosensitive layer.

The exposed areas were then transferred to a sheet of Kromekote paper by pressing the paper receptor against the imaged areas on the polyethylene terephthalate support at a temperature of 165° C.

Postexposure for 5 minutes using an ultraviolet light source hardened both the positive and negative images.

The polyoxyethylene lauryl ether of the foregoing examples was the monolauryl ether of a polyethylene glycol and had a density of 0.95 gram per cubic centimeter.

The embodiments of the invention in which an exclusive property or privilege is claimed are defined as follows:

1. An image forming process which comprises the steps, in order, of
   a. exposing, imagewise to actinic radiation an element comprising a support and an ethylenically unsaturated photohardenable solid layer to harden the exposed areas of said layer while leaving underexposed areas unhardened;
   b. transferring the underexposed areas of said layer at a temperature between the softening point of the exposed and underexposed areas to a receptor surface; and
   c. heating the exposed areas remaining on said support to a temperature above their softening point and transferring said areas to a second receptor surface.

2. A process according to claim 1, wherein the photohardenable layer is a photopolymerizable layer and contains at least one addition polymerizable ethylenically unsaturated compound and an addition polymerization initiator.

3. A process according to claim 2, wherein the unsaturated compound is a polyoxyethylated trimethylolpropane triacrylate.

4. A process according to claim 2, wherein the unsaturated compound is a polyoxyethylated trimethylolpropane triacrylate, and the layer contains a methyl methacrylate polymer.

5. A process according to claim 1, wherein said support is a thin flexible macromolecular organic polymer film.

6. A process according to claim 1, wherein between step (a) and step (b) the photohardenable solid layer is toned with a colorant adherent to both the exposed and unexposed areas.

7. A process according to claim 1 which comprises further hardening the transferred layers by exposing them to actinic radiation.

8. An image-forming process according to claim 1, wherein said element has a receptor sheet laminated to the photohardenable layer, at least the support or the receptor sheet being transparent to actinic radiation, and step (b) comprises removing the receptor sheet at a temperature between the softening point of the exposed and underexposed areas with unhardened underexposed areas of the layer adherent to said sheet.

9. A process according to claim 8, wherein said hardened exposed areas of said layer are toned with colorant before transfer to said second receptor surface.

* * * * *